United States Patent
Razeghi et al.

(12)
(75) Inventors: Manijeh Razeghi, Wilmette; Patrick Kung, Evanston, both of IL (US)

(73) Assignee: MP Technologies, Wilmette, IL (US)

(*) Notice: Subject to any disclaimer, the term of this patent is extended or adjusted under 35 U.S.C. 154(b) by 0 days.

(21) Appl. No.: 09/369,535

(22) Filed: Aug. 6, 1999

Related U.S. Application Data
(60) Provisional application No. 60/095,947, filed on Aug. 10, 1998.

(51) Int. Cl.$^7$ .................................................. H01L 21/20
(52) U.S. Cl. .................................................. 438/481
(58) Field of Search ............................ 438/46, 458, 479, 438/481, 938, 967; 117/101, 915, 952

(54) FABRICATION OF DEFECT FREE III-NITRIDE MATERIALS

(10) Patent No.: US 6,271,104 B1
(45) Date of Patent: Aug. 7, 2001

(56) References Cited

U.S. PATENT DOCUMENTS
5,362,682 * 11/1994 Bozler et al. ................... 438/458

OTHER PUBLICATIONS
Usui, A. et al., "Thick GaN epitaxial growth with low dislocation density by hydride vapor phase epitaxy", Jpn. J. Appl. Phys. vol. 36 Part 2 No. 7B, pp. L899–L902, Jul. 1997.*
Nakamura et al., "Present status of InGaN/GaN/AlGaN based laser diodes", Proceedings of the Second International Conference on Nitride Semiconductors (CNS'97) pp. 444–446, Oct. 1997.*
Zhang, X., Walker, D., Saxler, A., Kung, P., Xu, J., and Razeghi, M. Observation of inversion layers at AlN–Si interfaces fabricated by metal organic chemical vapour deposition. (Aug. 15, 1996) Electronic Letters, vol. 32, No. 17, pp. 1622–1623.
Kung, P., Saxler, A., Walker, D., Zhang, X., Lavado, R., Kim, K.S., and Razeghi, M. $Al_x Ga_{1-x}$ N Based Materials and Heterostructures. (1997) Material Research Society Symposium Proceedings vol. 449, pp. 79–84.
Razeghi, M., Kung, P., Walker, D., Sandvik, P., Hamilton, M., Mi, K., Zhang, X., and Diaz, J. LEO of III–Nitride on $Al_2 O_3$ and Si Substrates. (Aug. 2, 1999) Lateral Epitaxial Overgrowth (From Theory to Design) Workshop, Office of Naval Research and TMS. pp. 8.
Kung, P., Walker, D., Sandvik, P., Hamilton, M., Diaz, J., Lee, I.H., and Razeghi, M. Schottky MSM photodetectors on GaN films grown on sapphire by lateral epitaxial overgrowth. (Jan. 1999) SPIE vol. 3629, pp. 223–229.
Kung, P. Walker, D., Hamilton, M., Diaz, J., and Razeghi, M. Lateral epitaxial overgrowth of GaN films on sapphire and silicon substrates. (Jan. 25, 1999) Applied Physics Letters, vol. 74, No. 4, pp. 570–572.
Kung, P., Zhang, X., Walker, D., Saxler, A., and Razeghi, M. GaN p–i–n photodiodes with high visible-to-ultraviolet rejection ratio. SPIE vol. 3287, pp. 214–219.

Walker, D., Saxler, A., Kung, P., Zhang, X., Hamilton, M., Diaz, J., and Razeghi, M. Visible blind GaN p–i–n photodiodes. (Jun. 22, 1998) Applied Physics Letters, vol. 72, No. 25, pp. 3303–3305.
Razeghi, M., Kung, P., Walker, D., Monroy, E., Hamilton, M., and Sandvik, M. Development of High–performance III–Nitride–based Semiconductor Devices. (Jun. 1999) Journal of the Korean Physical Society, vol. 34, pp. S234–S243.
Razeghi, M., Kung, P., Walker, D., Hamilton, M., Diaz, J. High quality LEO growth and characterization of GaN films on $Al_2 O_3$ and Si substrates. SPIE vol. 3725, pp. 14–20.
Lee, I.H., Lee, J.J, Kung, P., Sanchez, F.J., and Razeghi, M. Band–gap narrowing and potential fluctuation in Si–doped GaN. (Jan. 4, 1999) Applied Physics Letters, vol. 74, No. 1, pp. 102–104.
Walker, D., Kung, P., Sandvik., P., Wu., J., Hamilton, M., Lee, I.H., Diaz, J., and Razeghi, M. $Al_x Ga_{1-x}$ N p–i–n photodiodes on sapphire substrates. SPIE vol. 3629, pp. 193–198.
Saxler, A., Ahoujja., M., Mitchel, W.C., Kung, P., Walker, D., and Razeghi, M. Electrical characterization of $Al_x Ga_{1-x}$ N for UV photodetector applications. SPIE vol. 3629, pp. 211–222.
Saxler, A., and Mitchel, W.C. $Al_x Ga_{1-x}$ N aluminum gallium nitride short–period superlattices doped with magnesium. (Apr. 5, 1999) Applied Physics Letters , vol. 74, No. 14, pp. 2023–2023.
Walker, D., Monroy, E., Kung, P., Wu, J., Hamilton, M., Sanchez, F.J., Diaz, J., and Razeghi, M. High–speed, low–noise metal–semiconductor–mental ultraviolet photodetectors based on GaN. (Feb. 1, 1999) Applied Physics Letters, vol. 74, No. 5, pp. 762–764.
Monroy, E., Hamilton, M., Walker, D., Kung, P., Sanchez, F.J., and Razeghi, M. High–quality visible blind AlGaN p–i–n photodiodes. (Feb. 22, 1999) Applied Physics Letters, vol.74, No. 5, pp. 1171–1173.

(List continued on next page.)

*Primary Examiner*—Keith Christianson
(74) *Attorney, Agent, or Firm*—Welsh & Katz, Ltd.

(57) ABSTRACT

The subject invention involves a method of preparing defect-free semiconductor material layers by growing a semiconductor material buffer layer on a substrate, masking with a dielectric film, and etching to open spaced seed windows. Another layer of a III-V or II-VI material is then grown in the longitudinal direction from the seed window, followed by lateral growth of the same material to form an epitaxial film and a structure which provides a defect free surface for further epitaxial layers.

5 Claims, No Drawings

OTHER PUBLICATIONS

Hahn, D.N., Kiehne, G.T., Ketterson, J.B. Phase–matched optical second–harmonic generation in GaN and AlN slab waveguides. (Mar. 1, 1999) Journal of Applied Physics, vol. 85, No. 5, pp. 2497–2501.

Kung, P., Saxler, A., Zhang, X., Walker, D., Wang, T.C., Ferguson, I., and Razeghi, M. High quality AlN and GaN epilayers grown on (00–1) sapphire, (100), and (111) silicon substrates. (May 29, 1995) Applied Physics Letters, vol. 66, No. 22, pp. 2958–2960.

Saxler, A., Kung, P., Sun, C.J., Bigan, E., and Razeghi, M. High quality aluminum nitride epitaxial layers grown on sapphire substrates. (Jan. 17, 1994) Applied Physics Letters, vol. 64, No. 3, pp. 339–341.

* cited by examiner

FABRICATION OF DEFECT FREE III-NITRIDE MATERIALS

This application claims benefit of provisional No. 60/095,947 filed Aug. 10, 1998.

The United States Government has rights in this invention pursuant to BMDO/ONR Contract No. 000014-93-1-0235.

BACKGROUND OF THE INVENTION

This application relates to a method for preparing semiconductor materials and devices, and more particularly to a method of preparing defect free layers of semiconductor materials for use as a substrate or a buffer layer in a semiconductor device.

The growth of high quality, defect free semiconductor materials for use as a substrate or a buffer layer in a semiconductor device is a prerequisite for the subsequent growth of high quality semiconductor layers in the device.

The preparation of defect free semiconductor materials is easiest when a substrate of the same material is used. However, often times this is not possible and defects are created during the preparation of the semiconductor at the interface between the semiconductor and the substrate, as a result of the lattice and thermal mismatch between the semiconductor and the substrate materials. Buffer layers and other multi-layer schemes are often used to form a transition between the substrate and the semiconductor layer, but these have proven insufficient in many cases.

For example, in the case of III-Nitride semiconductor materials, many of the defects propagate nearly along the growth direction, that is perpendicular to the substrate/layer interface, without stopping as the film is grown thicker. It is therefore necessary to effectively stop the propagation of these defects.

SUMMARY OF THE INVENTION

An object then of the subject invention is the growth of a high quality layer of semiconductor material.

A further object is the growth of defect-free III-Nitride materials.

These and other objects are attained by the subject invention which comprises the method of preparing defect-free semiconductor material layers by growing the semiconductor material buffer layer under optimum conditions on the substrate; the buffer layer was grown thin (10 Å–10000 Å); the buffer layer is next masked with a dielectric film which is then etched to open periodic seed windows having a width of 0.1–50 $\mu$m and periods of 0.2–500 $\mu$m. The length of the seed window can be as long as needed and may reach the edges of the substrate wafer. Another layer of a III-V or II-VI material is then grown in the longitudinal direction from the seed window, followed by lateral growth of the same material to form an epitaxial film and a structure which provides a defect free surface for further epitaxial layers. The substrate may also be removed by an etching solution to yield a defect free semiconductor material layer for use as a substrate.

DETAILED DESCRIPTION OF THE INVENTION

The reactor and associated gas-distribution scheme used herein are substantially as described in U.S. Pat. No. 5,384,151. The system comprises a cooled quartz reaction tube (diameter 5 cm in the substrate area) pumped by a high-capacity roughing pump (120hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas sources used in this study for the growth of GaN, AlGaN, and GaInN by LP-MOCVD are listed below.

| Group-III Sources | Group-V Source |
| --- | --- |
| Al(CH$_3$)$_3$ | t-butylamine |
| Al(C$_2$H$_5$)$_3$ | NH$_3$ |
| In(CH$_3$)$_3$ | |
| In(C$_2$H$_5$)$_3$ | |
| (CH$_3$)$_2$In(C$_2$H$_5$) | |
| Ga(CH$_3$)$_3$ | |
| Ga(C$_2$H$_5$)$_3$ | |

An accurately metered flow of purified H$_2$ or N$_2$ is passed through the appropriate bubbler. To ensure that the source material remains in vapor form, the saturated vapor that emerges from the bottle is immediately diluted by a flow of hydrogen or N$_2$. The mole fraction, and thus the partial pressure, of the source species is lower in the mixture and is prevented from condensing in the stainless steel pipe work.

The metal alkyl or hydride flow can be either injected into the reactor or into the waste line by using two-way valves. In each case, the source flow is first switched into the waste line to establish the flow rate and then switched into the reactor. The total gas flow rate is about 8 liters min$^{-1}$ during growth. Stable flows are achieved by the use of mass flow controllers.

The dielectric film etching solution used in the subject invention may be any of those commonly used, such as a solution of sulfuric acid and hydrogen peroxide. Alternatively, a solution of HF and ammonium fluoride may be used.

The substrate can be GaAs, Si, Al$_2$O$_3$, MgO, SiC, ZnO, LiGaO$_2$, LiAlO$_2$, MgAl$_2$O$_4$ or GaN. Preferably, Si is used as the substrate. The epitaxial layer quality is sensitive to the pretreatment of the substrate and the alloy composition. Pretreatment of the substrates prior to the procedure of the subject invention was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;

4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

The epitaxial layers of the subject invention may be grown by low-pressure metalorganic chemical vapor deposition (LP-MOCVD), although MBE, LPE and VPE procedures may be used with equal effect.

Growth takes place in MOCVD procedures by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 500 and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

High quality III-V layers may be grown in the method of the subject invention by low pressure metalorganic chemical vapor deposition (LP-MOCVD) although MBE, LPE and VPE may be used as stated above. The layers are grown by an induction-heated horizontal cool wall reactor. The sources set forth above are typically used as the sources for the element desired. Pure and diluted ammonia gas ($NH_3$) is generally used as the N source although other substrates such as GaAs, Si, MgO, SiC, ZnO, $LiGaO_2$, $LiAlO_2$, $MgAl_2O_4$ or GaN can be used. A buffer layer of AlN, GaN, InN, GaAs, GaP or any alloy of these may be individually laid at thicknesses from 500 Å to a few microns. The optimum growth conditions for representative layers are listed in Table 1.

The films of the subject invention were grown on semi-insulating substrates such as Si using a horizontal, rf-heated, LP-MOCVD reactor. Triethyl Gallium (TEG), was used as the precursor of Gallium; Ammonia, $NH_3$, was used as the precursor of N. Palladium-diffused hydrogen was used as a carrier gas with a total flow rate of 1.5 l/min. Growth conditions, such as temperature, pressure and V/III ratio, were varied to obtain good quality films as shown for a few III-V compounds in Table I. II-VI compounds may also be utilized in the method of the subject invention.

In one embodiment of the invention, a conventional SOI technique using the ELO (Epitaxial Lateral Overgrowth) method "Lateral Epitaxial Overgrowth of Silicon on $SiO_2$," by D. D. Rathman et al., JOURNAL OF ELECTROCHEMICAL SOCIETY SOLID-STATE SCIENCE AND TECHNOLOGY, October, 1982, p. 2303) may be used. First a semiconductor layer of AlN, GaN, InN, GaAs, GaP or any alloy of these is grown on top of a semiconductor substrate such as GaAs, Si, $Al_2O_3$, MgO, SiC, ZnO, $LiGaO_2$, $LiAlO_2$, $MgAl_2O_4$ or GaN. Then, a barrier film made of dielectric such $SiO_2$, $Al_2O_3$, $Si_3N_4$, or of a metal is then deposited on the previously grown semiconductor layer. The barrier film is then covered with photoresist and a pattern is applied through conventional photolithography to achieve exposed and covered areas on the barrier film. The exposed areas of the barrier film are then etched using an etching solution to thereby open seed windows. This is followed by selective growth of GaN in the longitudinal direction from the seed windows and, subsequently, lateral epitaxial growth, to form a low defect epitaxial layer on the barrier layer.

Once a complete low defective GaN layer is formed, a semiconductor device can be grown on it.

TABLE 1

Optimum growth conditions for representative semiconductor materials.

|  | GaInN | GaN |
| --- | --- | --- |
| Growth Pressure | 76 | 76 |
| Growth Temperature (° C.) | ~800 | 1000 |
| Total $H_2$ Flow Rates | 3 | 3 |
| TMI (cc/min) | 200 | — |
| TEG (cc/min) | 120 | 120 |
| $NH_3$ (cc/min) | ~3000 | ~3000 |
| $Al(CH_3)_3$ (cc/min) | — | — |
| $As(CH_3)_3$ (l/min.) | — | — |
| Growth Rate (Å/min) | 30 | 250 |

EXAMPLE

Very thin (500 Å) AlN buffer layers were grown on (111) Si substrates and used as template layers for the subsequent LEO procedure.

Single crystal undoped GaN films were then grown on the AlN buffer layers on (111) Si substrates. By reducing the thickness of the GaN(down to 2000 Å), it was possible to achieve crack free films.

The GaN layer is masked and etched using a HF solution buffered with ammonium fluoride and distilled water, thereby opening a seed window. Selective epitaxial growth of GaN in the longitudinal direction from the seed windows follows. Lateral epitaxial growth follows to form an epitaxial layer of GaN.

This structure may be used as a basis for growth of further epitaxial layers of different compositions or the $SiO_2$ substrate may be removed by etching or other process and the defect-free GaN layer may then be used as a substrate itself.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A method of preparing a semiconductor wafer, comprising the steps of:
   growing a buffer layer on a substrate;
   growing a barrier layer on said buffer layer;
   etching a pattern of openings in said barrier layer;
   growing a III-V material in the openings in a longitudinal direction from said openings and then in a lateral direction from said openings to form a continuous layer; and
   growing a semiconductor device on said continuous layer.

2. The method of claim 1 wherein said barrier layer is GaAs, Si, MgO, SiC, ZnO, $LiGO_2$, $LiAlO_2$, $MgAl_2O$, or GaN.

3. The method of claim 1 wherein said barrier layer is $SiO_2$, $Al_2O_3$, $Si_3N_4$ or a metal.

4. The method of claim 1 wherein said III-IV material is GaN.

5. The method of claim 1 wherein further including the step of removing said substrate.

* * * * *